United States Patent
Toda

(10) Patent No.: US 7,732,895 B2
(45) Date of Patent: Jun. 8, 2010

(54) SEMICONDUCTOR DEVICE INCLUDING TRIPLE-STACKED STRUCTURES HAVING THE SAME STRUCTURE

(75) Inventor: Takeshi Toda, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 313 days.

(21) Appl. No.: 11/798,131

(22) Filed: May 10, 2007

(65) Prior Publication Data
US 2007/0262453 A1 Nov. 15, 2007

(30) Foreign Application Priority Data
May 11, 2006 (JP) .............................. 2006-132850

(51) Int. Cl.
*H01L 29/00* (2006.01)
(52) U.S. Cl. ................... 257/533; 257/532; 257/296; 257/306; 257/758; 257/924; 257/E27.025; 257/E29.343
(58) Field of Classification Search ................ 257/528, 257/296, 300, 306, 532, 533, 535, 536, 758, 257/919, 920, 923, 924, E27.025, E27.071, 257/E29.343, E27.033
See application file for complete search history.

(56) References Cited

U.S. PATENT DOCUMENTS

| 6,777,777 B1 * | 8/2004 | Kar-Roy et al. ............. 257/532 |
| 7,514,740 B2 * | 4/2009 | Hsu et al. ................... 257/316 |
| 2005/0082639 A1 * | 4/2005 | Kikuta et al. ............... 257/533 |
| 2005/0218520 A1 * | 10/2005 | Kikuta et al. ............... 257/758 |
| 2007/0152295 A1 * | 7/2007 | Yeh et al. .................... 257/516 |

FOREIGN PATENT DOCUMENTS

| JP | 2000-307062 | 11/2000 |
| JP | 2004-193602 | 7/2004 |
| KR | 2007005869 A * | 1/2007 |
| WO | WO 02/17367 A2 | 2/2002 |

OTHER PUBLICATIONS

KR-10-2007-0005869 (Machine Translation).*

* cited by examiner

*Primary Examiner*—Jerome Jackson, Jr.
*Assistant Examiner*—Yu Chen
(74) *Attorney, Agent, or Firm*—McGinn IP Law Group, PLLC

(57) ABSTRACT

In a semiconductor device, a plurality of triple-stacked structures all having the same structure are provided. Each of the triple-stacked structures includes one lower electrode layer, at least one upper electrode layer and one dielectric layer sandwiched by the lower electrode layer and the upper electrode layer.

15 Claims, 16 Drawing Sheets

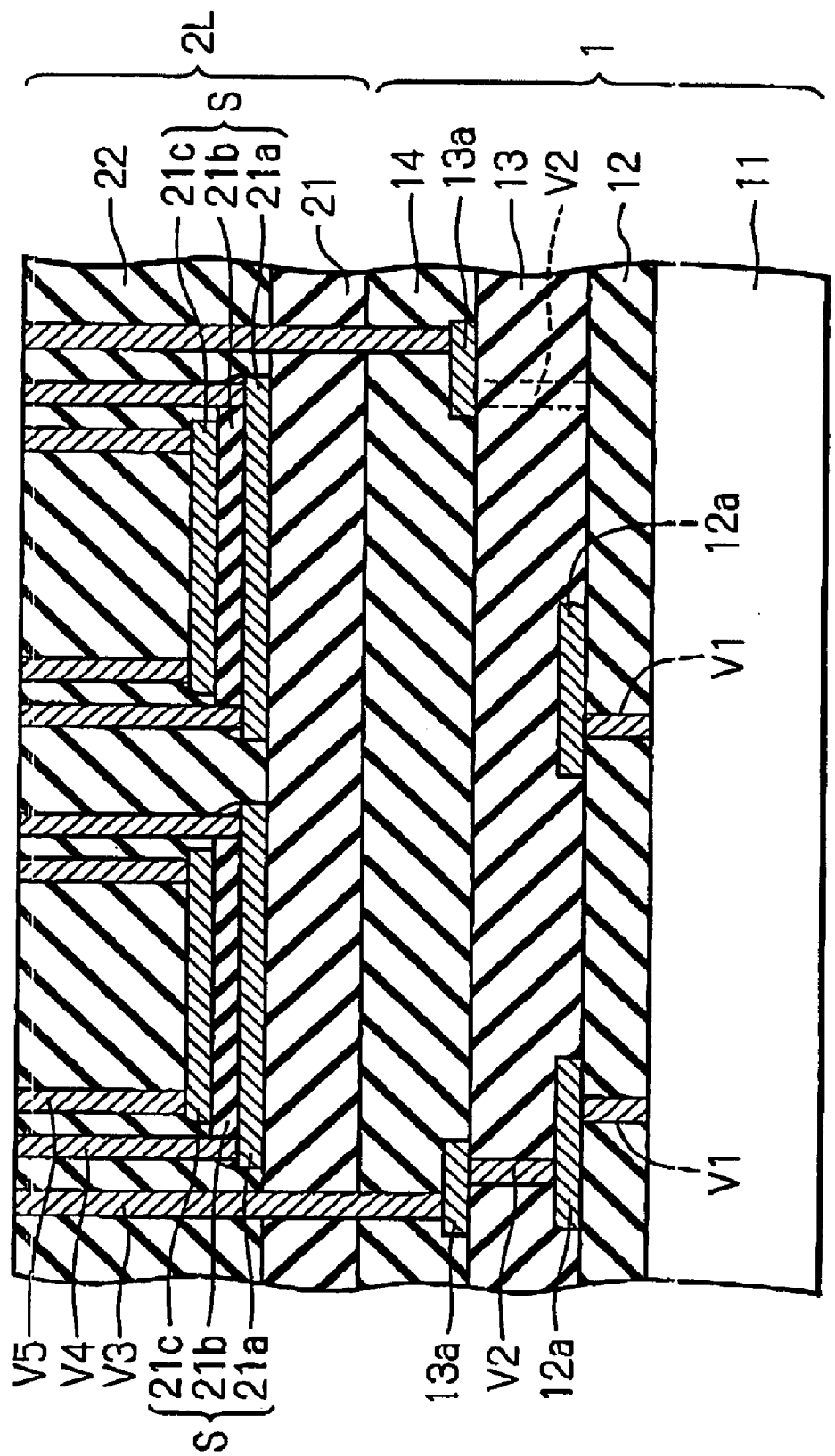

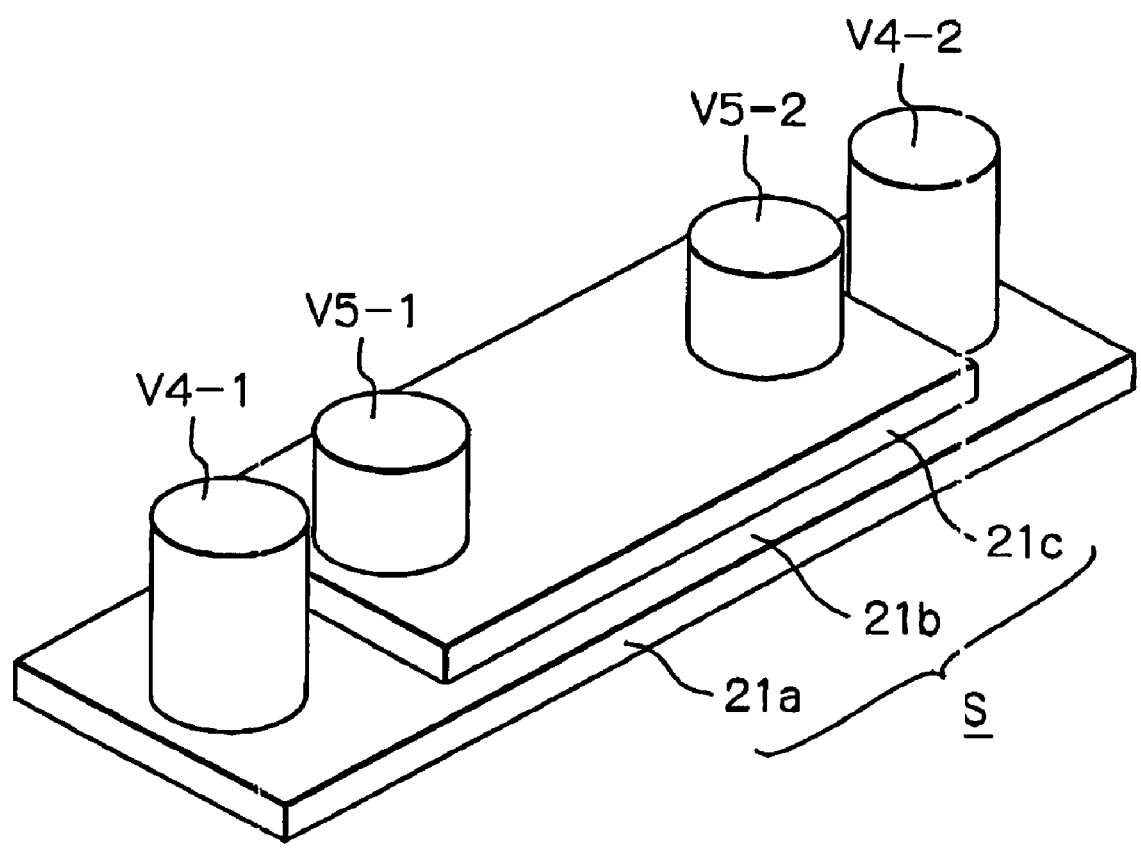

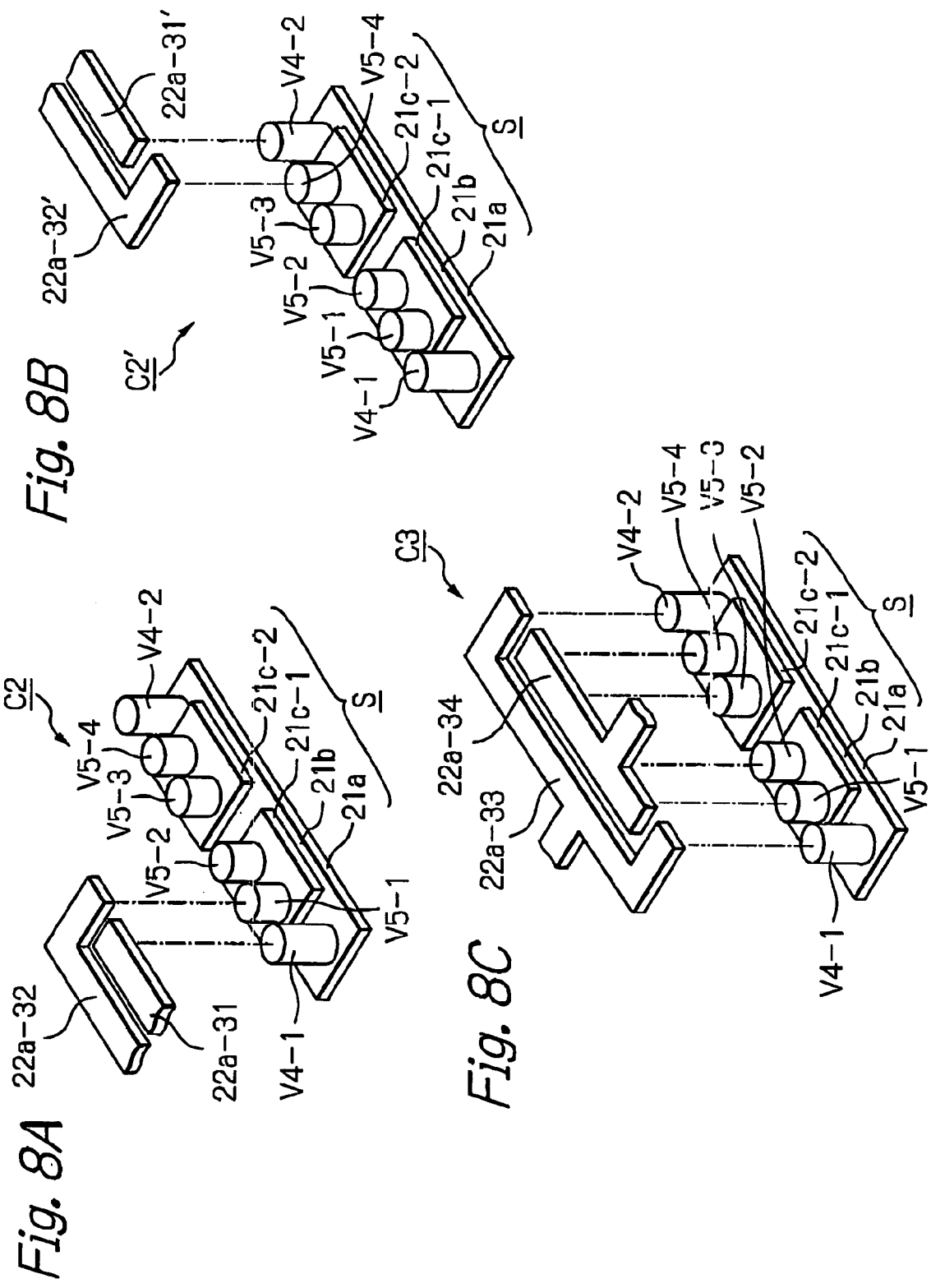

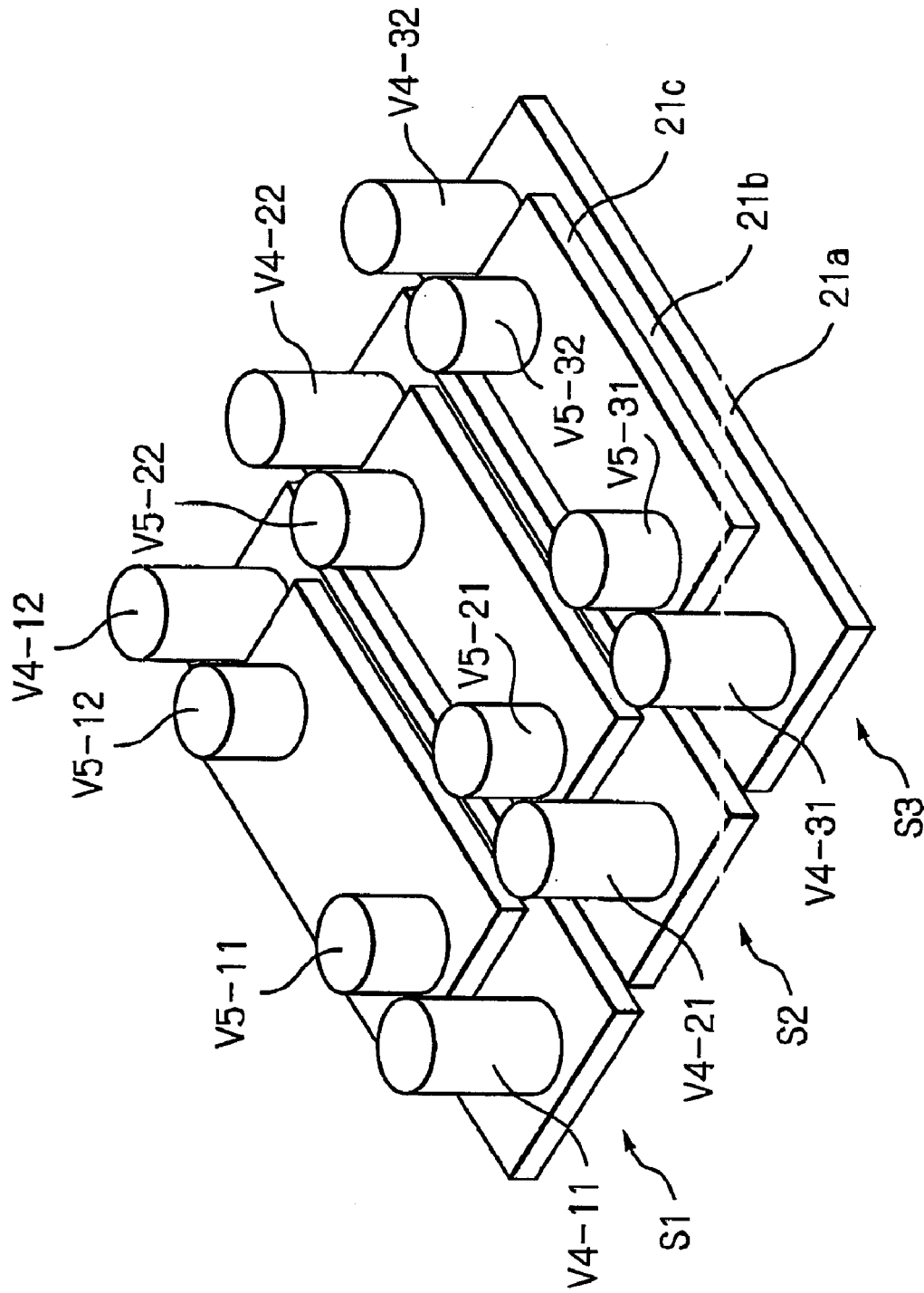

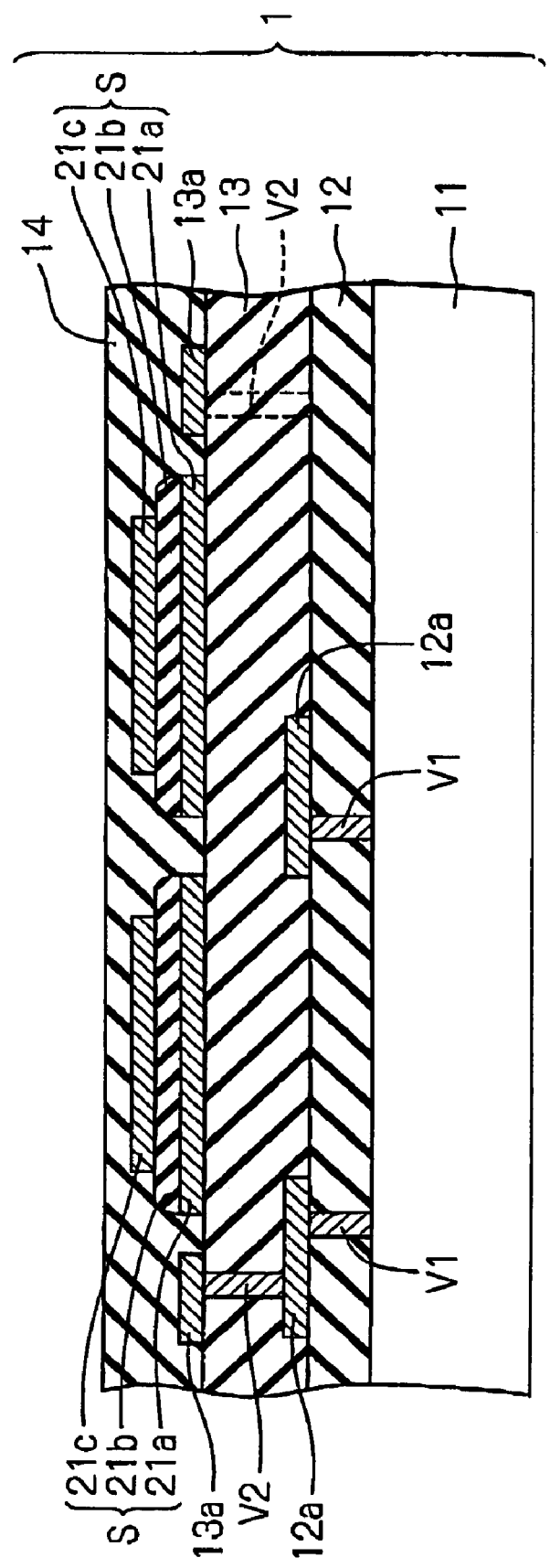

SEMICONDUCTOR DEVICE INCLUDING TRIPLE-STACKED STRUCTURES HAVING THE SAME STRUCTURE

BACKGROUND OF THE INVENTION

1. Field of the Invention

The present invention relates to a semiconductor device such as an application specific integrated circuit (ASIC), and more particularly, to capacitors and resistors having a metal-insulator-metal (MIM) structure.

2. Description of the Related Art

Generally, in ASIC semiconductor devices, a large number of semiconductor transistor circuits, capacitors and resistors are connected to each other in accordance with the customer's request. ASIC semiconductor devices are divided into cell-based ASIC semiconductor devices, master slice type ASIC semiconductor devices and the like. The master slice type ASIC semiconductor devices are disclosed in JP-2000-307062A.

On the other hand, structured ASIC semiconductor devices have been developed to reduce the turn around time and the manufacturing cost.

A prior art structured ASIC semiconductor device is constructed by a common-use section where basic logic cells (semiconductor transistor circuits), power supply lines, basic logic cell connections, macro connections and the like are formed, and a customized section where input/output connections and conductive pattern layers for the basic logic cells are formed. In this case, the common-use section is formed regardless of the customer's request, while the customized section is formed in accordance with the customer's request.

Also, passive elements such as metal-insulator-metal (MIM) capacitors and MIM resistors are disclosed in JP-2004-193602A, WO02/17367A2 and U.S. Patent Application Publication No. 2005/0082639 A1.

Particularly, referring to U.S. Patent Application Publication No. 2005/0082639 A1, in order to realize an MIM capacitor and an MIM resistor, triple-stacked structures each including one lower electrode layer, one upper electrode layer and one dielectric layer sandwiched by the lower electrode layer and the upper electrode layer are provided.

SUMMARY OF THE INVENTION

In the above-described prior art MIM capacitor and MIM resistor, however, the triple-stacked structure for the MIM resistor is different from the triple-stacked structure for the MIM resistor. Also, if the capacitance of one MIM capacitor is different from that of another MIM capacitor, the triple-stacked structure for the one MIM capacitor would be different from the triple-stacked structure for the other MIM capacitor. Similarly, if the resistance value of one MIM resistor is different from the resistance value of another MIM resistor, the triple-stacked structure for the one MIM resistor would be different from the triple-stacked structure for the other MIM resistor. Therefore, in order to completely comply with the customer's request, a large number of triple-stacked structures having different structures from each other need to be formed within a customized section of a structured ASIC semiconductor device. As a result, the time turn around time and the manufacturing cost would be increased. Also, since the number of kinds of triple-stacked structures is limited, the number of realized MIM capacitors and realized MIM resistors would be decreased.

According to the present invention, in a semiconductor device, a plurality of triple-stacked structures all having the same structure are provided. Each of the triple-stacked structures includes one lower electrode layer, at least one upper electrode layer and one dielectric layer sandwiched by the lower electrode layer and the upper electrode layer. As a result, if the same via structures are formed on the lower electrode layer and the upper electrode layer of each of the triple-stacked structures and different conductive pattern layers are formed for the via structures, MIM capacitors having different capacitance values and MIM resistors having different resistance values can be realized.

Also, the above-described triple-stacked structures all having the same structure are formed in a customized section or a common-use section of a structured ASIC semiconductor device.

BRIEF DESCRIPTION OF THE DRAWINGS

The present invention will be more clearly understood from the description set forth below, with reference to the accompanying drawings, wherein:

FIGS. 1A, 1B and 1C are cross-sectional views for explaining a first embodiment of the method for manufacturing semiconductor device according to the present invention;

FIG. 2 is a perspective view illustrating a first example of the stacked structure of FIGS. 1A, 1B and 1C;

FIGS. 8A, 8B and 8C are exploded, perspective views illustrating MIM capacitors obtained from the stacked structure of FIG. 7;

FIG. 9 is a perspective view illustrating a fourth example of the stacked structure of FIGS. 1A, 1B and 1C;

FIGS. 12A and 12B are cross-sectional views for explaining a second embodiment of the method for Manufacturing a semiconductor device according to the present invention.

DESCRIPTION OF THE PREFERRED EMBODIMENTS

A first embodiment of the method for manufacturing a semiconductor device using a structured ASIC technology according to the present invention is explained with reference to FIGS. 1A, 1B and 1C.

Figure 1A:
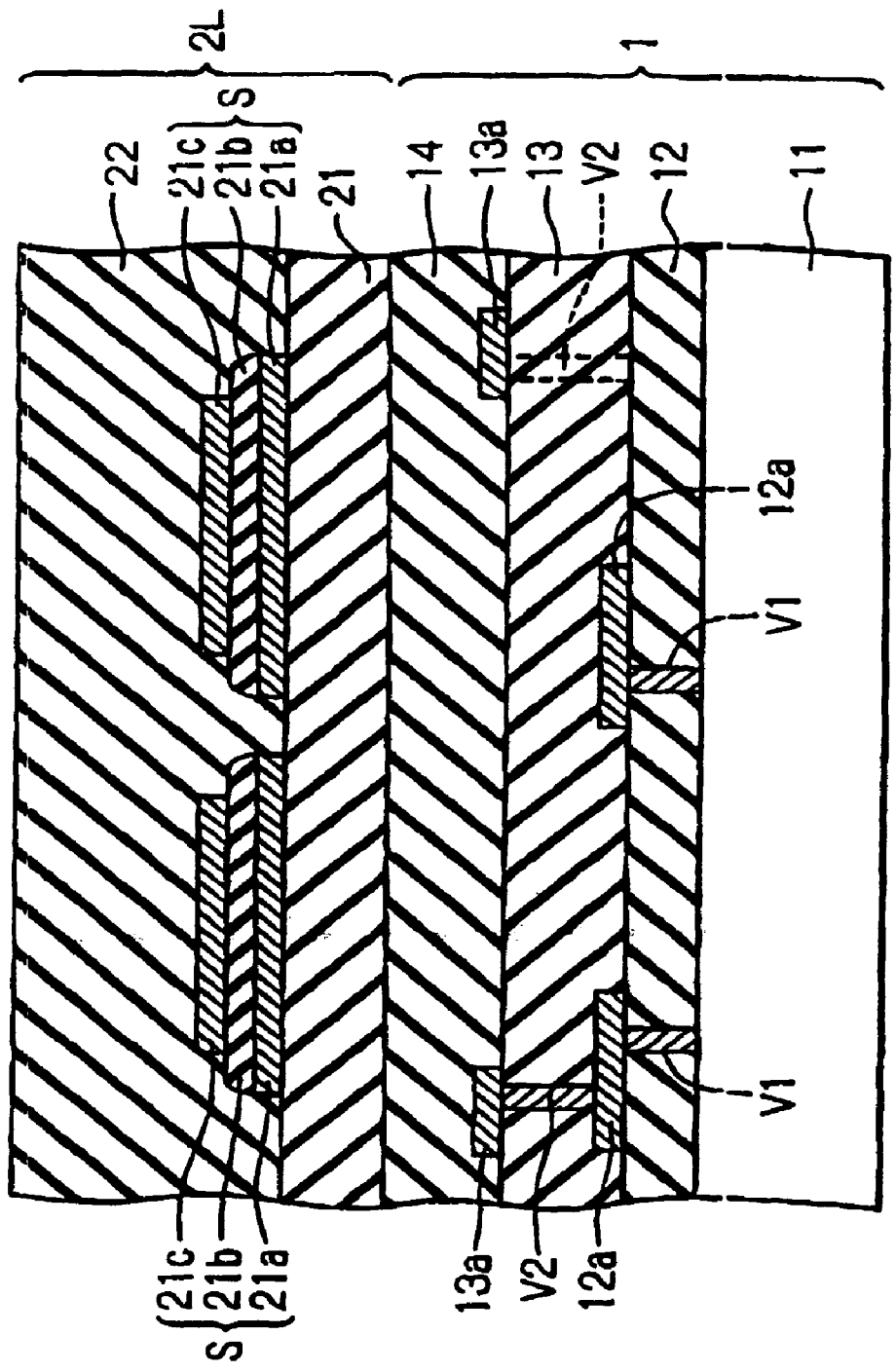

First, referring to FIG. 1A, a semiconductor device is constructed by a common-use section 1 and a lower customized section 2L.

The common-use section 1 is formed by a semiconductor substrate 11 where impurity diffusion regions, isolation regions and the like (not shown) for semiconductor transistor circuits are formed, and a plurality of insulating interlayers 12, 13 and 14 sequentially formed on the semiconductor substrate 11. In this case, conductive pattern layers 12a are formed on the insulating interlayer 12 before the formation of the insulating interlayer 13, and conductive pattern layers 13a are formed on the insulating interlayer 13 before the formation of the insulating interlayer 14. Also, via structures (or plug structures) V1 are formed within the insulating interlayer 12 so that the conductive pattern layers 12a are connected to respective impurity diffusion regions of the semiconductor substrate 11 and gates of the transistors. Further, via structures (or plug structures) V2 are formed within the insulating interlayer 13 so that the conductive pattern layers 13a are connected to respective conductive pattern layers 12a.

The lower customized section 2L is formed by insulating interlayers 21 and 22 sequentially formed on the common-use section 1. In this case, a plurality of triple-stacked structures (simply referred to as a stacked structures) S having the same structure are formed on the insulating interlayer 21 before the formation of the insulating layer 22.

Each of the stacked structures S is formed by a lower electrode layers 21a, a dielectric layer 21b and an upper electrode layer 21c. The lower electrode layers 21a are located on the same plane, the dielectric layers 21b are located on the same plane, and the upper electrode layers 21c are located on the same plane.

The stacked structures S are manufactured as follows. That is, three layers for the lower electrode layers 21a, the dielectric layers 21b and the upper electrode layers 21c are sequentially deposited on the insulating interlayer 21. Then, the layer for the upper electrode layer 21a is patterned by a photolithography and etching process to complete the upper electrode layers 21c. Then, the layer for the dielectric layers 21b and the layer for the lower electrode layers 21c are together patterned by a photolithography and etching process to complete the dielectric layers 21b and the lower electrode layers 21a. Thus, each of the dielectric layers 21b is provided separately for one of the stacked structures S.

Note that the thickness of the dielectric layers 21b and the thickness and size of the lower electrode layers 21a and the upper electrode layers 21c are slightly changed upon receipt of the customer's request.

Next, referring to FIG. 1B, via structures (or plug structures) V3, V4 and V5 are formed within the insulating layers 14, 21 and 22 regardless of the customers request. In this case, the via structures V3 lead to the conductive layers 13a, the via structures V4 lead to the lower electrode layers 21a, and the via structures V5 lead to the upper electrode layers 21c.

Finally, referring to FIG. 10, also upon receipt of the customer's request, an upper customized section 2U is formed on the lower customized section 2L. The upper customized section 2U is formed by an insulating layer 23. In this case, conductive pattern layers 22a are also formed on the insulating interlayer 22 to connect the via structures V3, V4 and V5 to each other.

Note that the via structures V1, V2, V3, V4 and V6 can be formed by forming via holes in the insulating interlayers and burying metal therein.

Thus, according to the customer's request, capacitors and resistors having metal-insulator-metal (MIM) structure are formed by the lower electrode layers 21a, the dielectric layers 21b and the upper electrode layers 21c in the lower customized section 2L, and the capacitors and the resistors are connected to the transistors in the semiconductor substrate 11.

Generally, in each of the stacked structures S, the lower electrode layer 21a and the upper electrode layer 21c are both elongated. Also, each of the electrode layers 21a and 21c are made of the same metal such as Ti, TiN, Ta or TaN having a size of about 1 to 500 μm × about 1 to 500 μm and a thickness of about 30 to 300 nm, which would improve the productivity. Further, the lower electrode layer 21a is outwardly protruded from the upper electrode layer 21c. For example, the lower electrode layer 21a is longer by about 0.5 μm or more than the upper electrode layer 21c.

Additionally, the via structures V4 are located on the lower electrode layer 21a. On the other hand, the via structures V5 are located on the upper electrode layer 21c.

According to the first embodiment, in the common-use section 1, semiconductor circuits are formed regardless of the customer's request. Also, in the customized sections 2L and 2U, the conductive pattern layers 22a are formed upon receipt of the customer's request. At this time, an MIM capacitor and MIM resistors having different resistance values are selected and formed in accordance with the customer's request. In more detail, in the customized section 2L, the capacitance values of the MIM capacitors and the resistance values of the MIM resistors can be slightly adjusted by the thickness of the dielectric layer 21b and the thickness and size of the electrode layers 21a and 21c upon receipt of the customer's request. Also, the MIM capacitor and the different resistance values of the MIM resistors can be selected by the conductive pattern layers 22a upon the receipt of the customer's request.

Note that, in the prior art, a definite MIM capacitor and MIM resistors having definite resistance values are formed regardless of the customer's request.

Figure 1C:
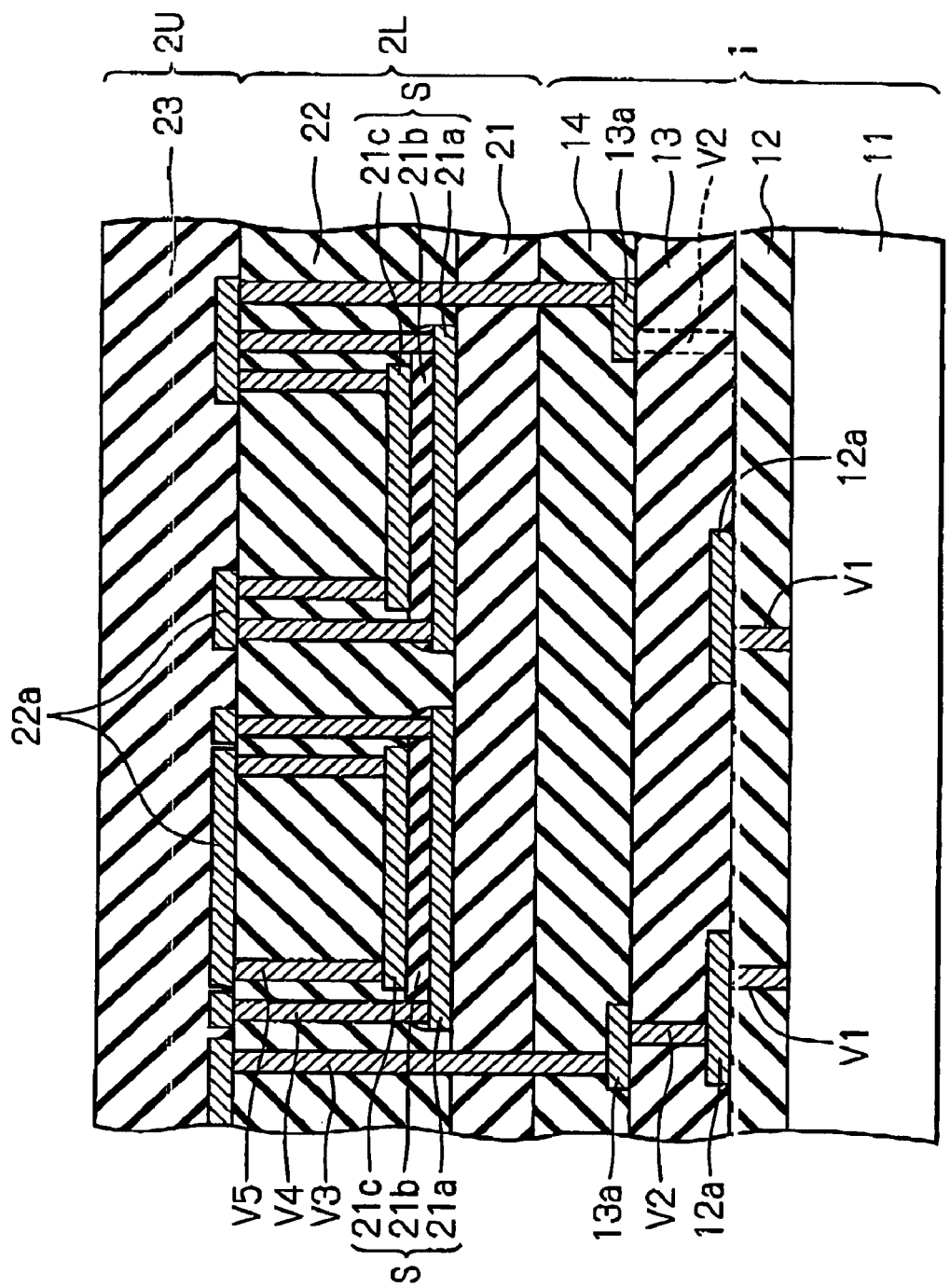

A first example of the stacked structure S of FIGS. 1A, 1B and 1C is explained next with reference to FIG. 2.

In FIG. 2, the lower electrode layer 21a is longer than the upper electrode layer 21c. Two via structures V4-1 and V4-2 are formed on the longitudinal sides of the lower electrode layer 21a, and two via structures V5-1 and V5-2 are formed on the longitudinal sides of the upper electrode layer 21c. As stated above, note that the thickness of the dielectric layer 21b and the thickness and size of the electric layers 21a and 21c are slightly changed upon receipt of the customer's request; however, the via structures V4-1, V4-2, V5-1 and V5-2 are formed regardless of the customer's request.

Figure 3:
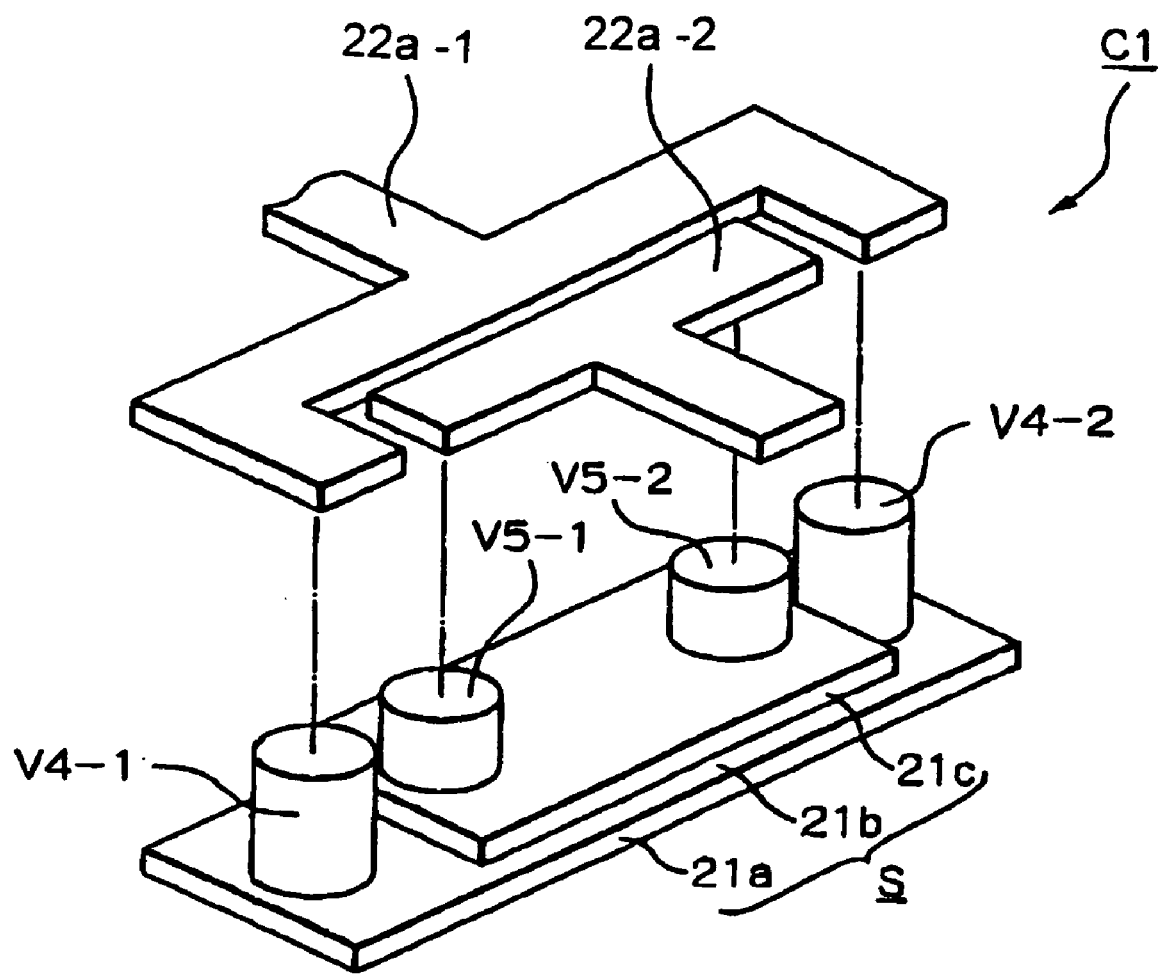
FIG. 3 is an exploded, perspective view illustrating an MIM capacitor obtained from the stacked structure of FIG. 2.

As illustrated in FIG. 3, upon receipt of the customer's request, conductive pattern layers 22a-1 and 22a-2 are formed, so that the conductive pattern layer 22a-1 is connected to the via structures V4-1 and V4-2, and the conductive pattern layer 22a-2 is connected to the via structures V5-1 and V5-2. As a result, an MIM capacitor C1 is obtained from the stacked structure S of FIG. 2.

Figure 4:
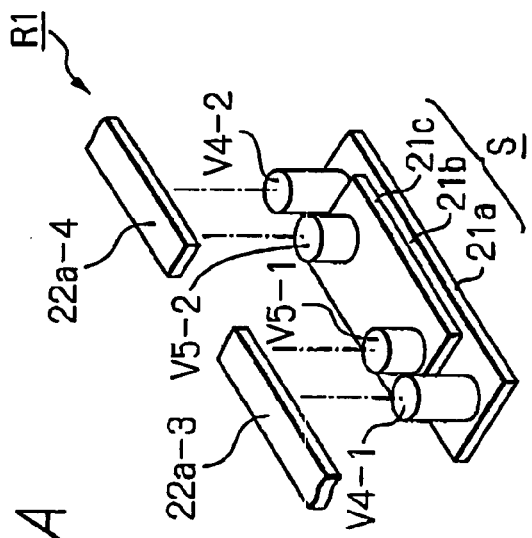
FIGS. 4A, 4B, 4C and 4D are exploded, perspective views illustrating MIM resistors obtained from the stacked structure of FIG. 2.

As illustrated in FIG. 4A, upon receipt of the customer's request, conductive pattern layers 22a-3 and 22a-4 are formed, so that the conductive pattern layer 22a-3 is connected to the via structures V4-1 and V5-1, and the conductive pattern layer 22a-4 is connected to the via structures V4-2 and V5-2. As a result, an MIM resistor R1 is obtained from the stacked structure S of FIG. 2.

As illustrated in FIG. 4B, upon receipt of the customer's request, conductive pattern layers 22a-5 and 22a-6 are formed, so that the conductive pattern layer 22a-5 is connected to the via structure V5-1, and the conductive pattern layer 22a-6 is connected to the via structure V5-2. As a result, an MIM resistor R2 is obtained from the stacked structure S of FIG. 2.

As illustrated in FIG. 4C, upon receipt of the customer's request, conductive pattern layers 22a-7 and 22a-8 are formed, so that the conductive pattern layer 22a-7 is connected to the via structure V4-1, and the conductive pattern layer 22a-8 is connected to the via structure V4-2. As a result, an MIM resistor R3 is obtained from the stacked structure S of FIG. 2.

As illustrated in FIG. 4D, upon receipt of the customer's request, conductive pattern layers 22a-9, 22a-10 and 22a-11 are formed, so that the conductive pattern layer 22a-9 is connected to the via structures V4-1, the conductive pattern layer 22a-10 is connected to the via structures V4-2 and V5-2, and the conductive pattern layer 22a-11 is connected to the via structure V5-1. As a result, an MIM resistor R4 is obtained from the stacked structure S of FIG. 2.

In FIGS. 4A, 4B, 4C and 4D, the resistance values of the MIM resistors R1, R2, R3 and R4 satisfy the following:

$$R1<R2<R3<R4$$

where R1, R2, R3 and R4 designate resistance values of the MIM resistors R1, R2, R3 and R4, per se.

Thus, in FIGS. 4A, 4B, 4C and 4D, four MIM resistors R1, R2, R3 and R4 can easily be obtained by simply changing the conductive pattern layers 22a.

A second example of the stacked structure S of FIGS. 1A, 1B and 1C is explained next with reference to FIG. 5.

Figure 5:
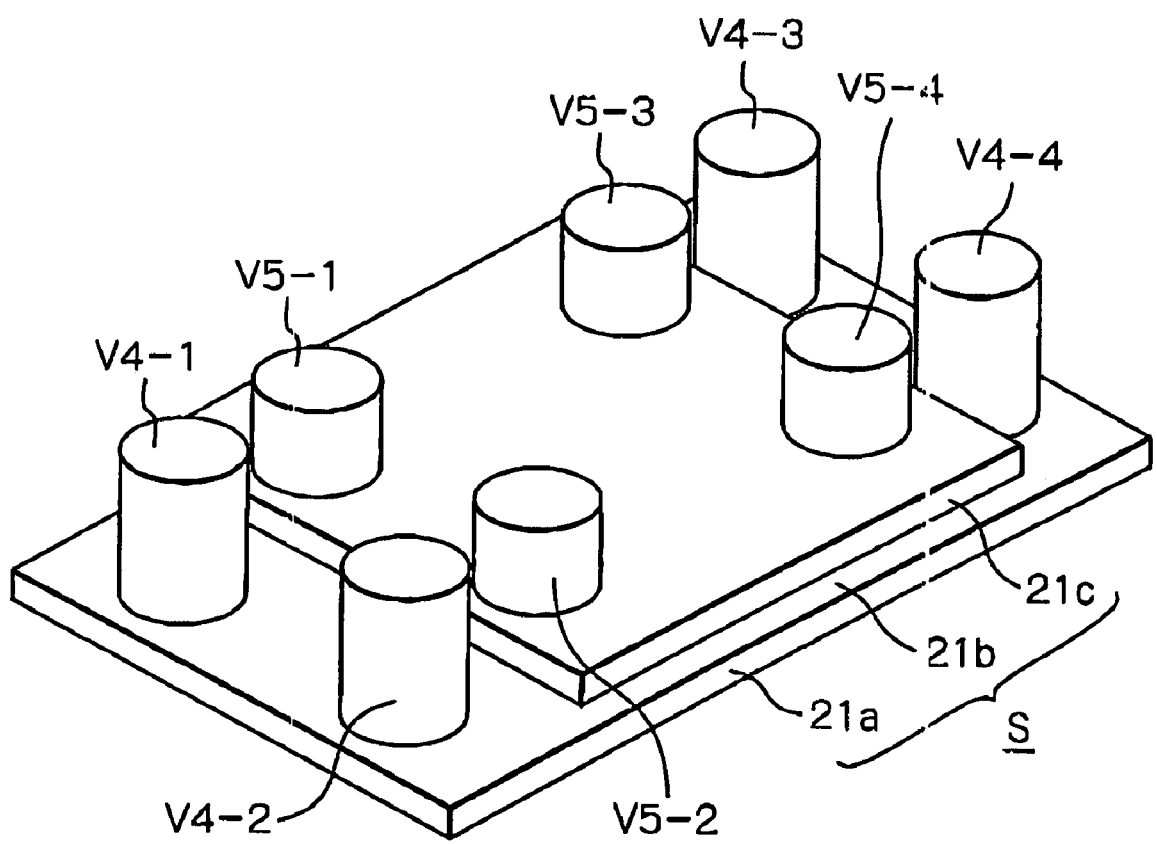
FIG. 5 is a perspective view illustrating a second example of the stacked structure of FIGS. 1A, 1B and 1C.

In FIG. 5, the lower electrode layer 21a is longer than the upper electrode layer 21c. Four via structures V4-1, V4-2, V4-3 and V4-4 are formed on the longitudinal sides of the lower electrode layer 21a, and four via structures V5-1, V5-2, V5-3 and V5-4 are formed on the longitudinal sides of the upper electrode layer 21c. As stated above, note that the thickness of the dielectric layer 21b and the thickness and size of the electrode layers 21a and 21c are slightly changed upon receipt of the customer's request; however, the via structures V4-1,V4-2, V4-3, V4-4, V5-1, V5-2, V5-3 and V5-4 are formed regardless of the customer's request.

Similar conductive pattern layers to those conductive pattern layers 22a-1, 22a-2, 22a-3, 22a-4, 22a-5, 22a-6, 22a-7, 22a-8, 22a-9, 22a-10 and 22a-11 of FIGS. 3, 4A, 4B, 4C and 4D can be provided to realize an MIM capacitor and MIM resistors.

Figure 6A:
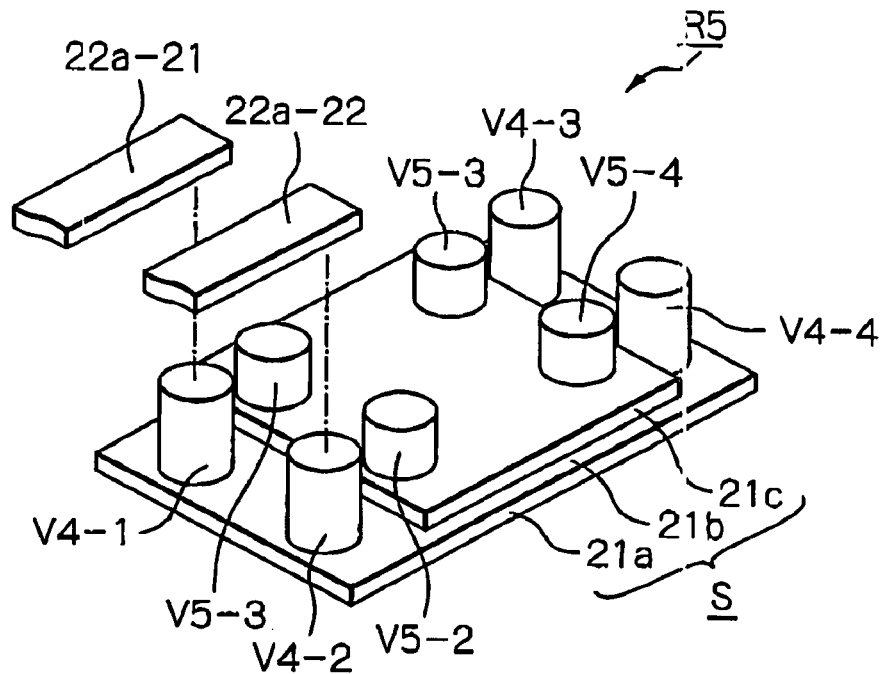
FIGS. 6A and 6B are exploded, perspective views illustrating MIM resistors obtained from the stacked structure of FIG. 5.

Also, as illustrated in FIG. 6A, upon receipt of the customer's request, conductive pattern layers 22a-21 and 22a-22 are formed, so that the conductive pattern layer 22a-21 is connected to the via structure V4-1, and the conductive pattern layer 22a-22 is connected to the via structure V4-2. As a result, an MIM resistor R5 (<R1) is obtained from the stacked structure S of FIG. 5.

Figure 6B:
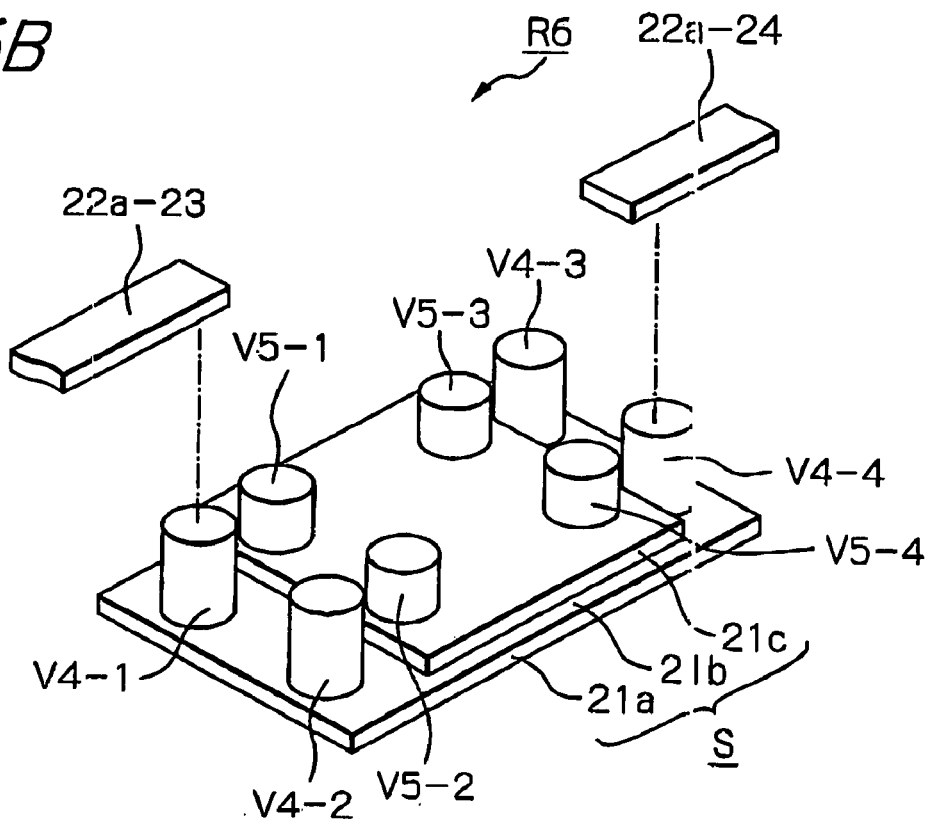

Further, as illustrated in FIG. 6B, upon receipt of the customer's request, conductive pattern layers 22a-23 and 22a-24 are formed, so that the conductive pattern layer 22a-23 is connected to the via structure V4-1, and the conductive pattern layer 22a-24 is connected to the via structure V4-4. As a result, an MIM resistor R6 (>R3) is obtained from the stacked structure S of FIG. 5.

A third example of the stacked structure S of FIGS. 1A, 1B and 1C is explained next with reference to FIG. 7.

Figure 7:
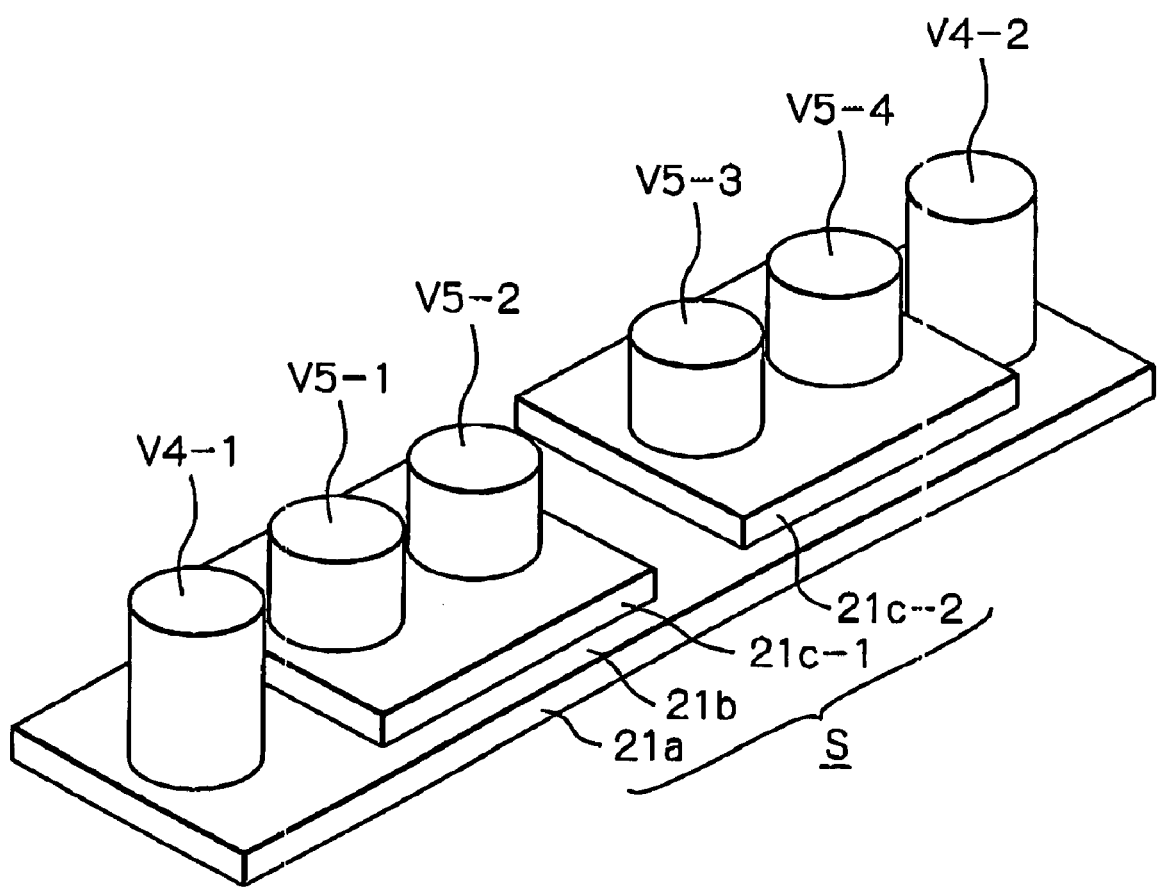
FIG. 7 is a perspective view illustrating a third example of the stacked structure of FIGS. 1A, 1B and 1C.

In FIG. 7, two upper electrode layers 21c-1 and 21c-2 are provided on the lower electrode layer 21a. Two via structures V4-1 and V4-2 are formed on the lower electrode layer 21a. On the other hand, two via structures V5-1 and V5-2 are formed on the upper electrode layer 21c-1, and two via structures V5-3 and V5-4 are formed on the upper electrode layer 21c-2. As stated above, note that the thickness of the dielectric layer 21b and the thickness and size of the electric layers 21a, 21c-1 and 21c-2 are slightly changed upon receipt of the customer's request; however, the via structures V4-1, V4-2, V5-1, V5-2, V5-3 and V5-4 are formed regardless of the customer's request.

Similar conductive pattern layers to those conductive pattern layers 22a-1, 22a-2, 22a-3, 22a-4, 22a-5, 22a-6, 22a-7, 22a-8, 22a-9, 22a-10 and 22a-11 of FIGS. 3, 4A, 4B, 4C and 4D can be provided to realize an MIM capacitor and MIM resistors.

Also, as illustrated in FIG. 8A, upon receipt of the customer's request, conductive pattern layers 22a-31 and 22a-32 are formed, so that the conductive pattern layer 22a-31 is connected to the via structure V4-1, and the conductive pattern layer 22a-32 is connected to the via structure V5-1. As a result, an MIM capacitor C2 (<C1) is obtained from the stacked structure S of FIG. 7.

On the other hand, as illustrated In FIG. 8B, upon receipt of the customer's request, conductive pattern layers 22a-31' and 22a-32' are formed, so that the conductive pattern layer 22a-31' is connected to the via structure V4-2, and the conductive pattern layer 22a-32' is connected to the via structure V5-4. As a result, if the size of the upper electrode layer 21c-2 is slightly different from that of the upper electrode layer 21c-1, an MIM capacitor C2' having a slightly different capacitance value from that of the MIM capacitor C2 of FIG. 8A is obtained from the stacked structure S of FIG. 7.

Further, as illustrated in FIG. 8C, upon receipt of the customer's request, conductive pattern layers 22a-33 and 22a-34 are formed, so that the conductive pattern layer 22a-33 is connected to the via structures V4-1 and V4-2, and the conductive pattern layer 22a-34 is connected to the via structures V5-1, V5-2, V5-3 and V5-4. As a result, an MIM capacitor C3 (>C1) is obtained from the stacked structure S of FIG. 7.

In FIG. 7, note that three or more upper electrode layers can be provided for one lower electrodes layer.

The wider the electrode layers 21a and 21c, the larger the number of realized MIM capacitors. In this point, the stacked structure S of FIG. 5 is advantageous over the stacked structures S of FIG. 3 and 7. On the other hand, the narrower the electrode layers 21a and 21c, the larger the number of realized MIM resistors. In this point, the stacked structures S of FIGS. 3 and 7 are advantageous over the stacked structure S of FIG. 5.

A fourth example of the stacked structure S of FIGS. 1A, 1B and 1C as illustrated in FIG. 9 is intended to increase the number of realized MIM capacitors as well as the number of realized MIM resistors.

In FIG. 9, three narrow stacked structures S1, S2 and S3 each having the same structure as the stacked structure S of FIG. 2 are arranged in parallel with each other to also realize a wide stacked structure. In more detail, in the stacked structure S1, two via structures V4-11 and V4-12 are formed on the longitudinal sides of the lower electrode layer 21a, and two via structures V5-11 and V5-12 are formed on the longitudinal sides of the upper electrode layer 21c. Also, in the stacked structure S2, two via structures V4-21 and V4-22 are formed on the longitudinal sides of the lower electrode layer 21a, and two via structures V5-21 and V5-22 are formed on the longitudinal sides of the upper electrode layer 21c. Further, in the stacked structure S3, two via structures V4-31 and V4-32 are formed on the longitudinal sides of the lower electrode layer 21a, and two via structures V5-31 and V5-32 are formed on the longitudinal sides of the upper electrode layer 21c.

Figure 10A:
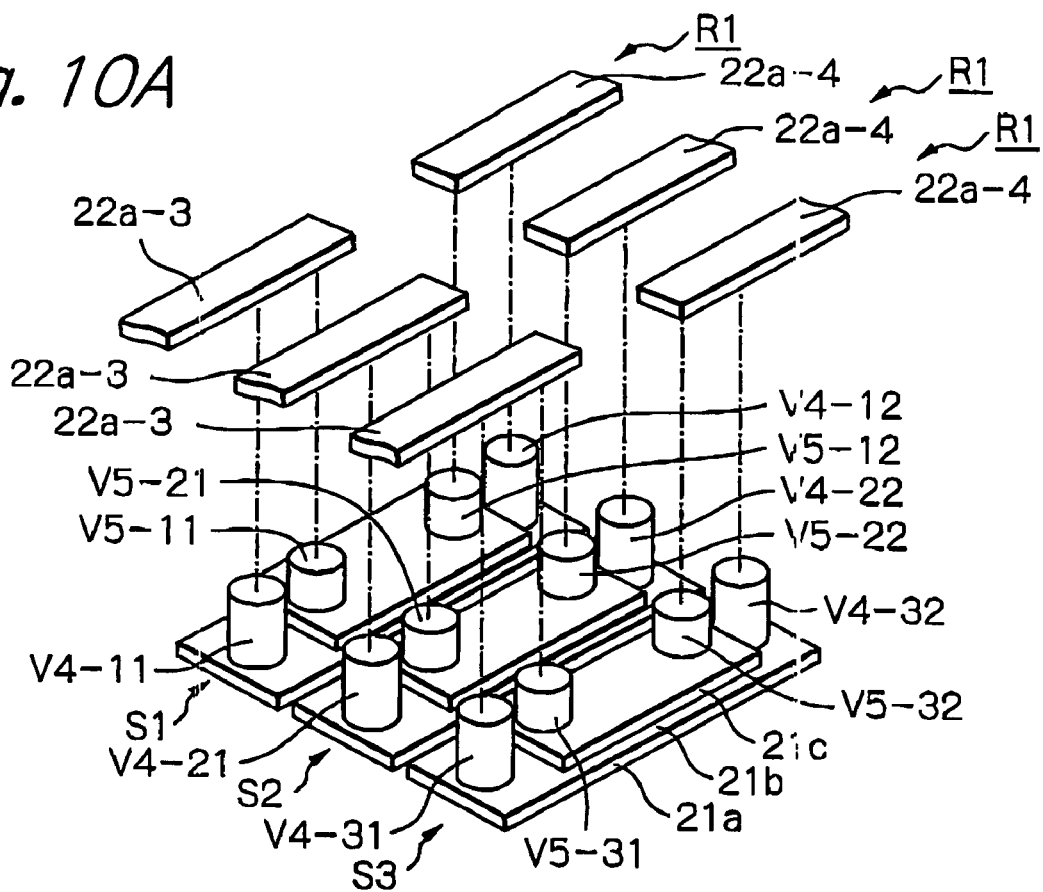
FIG. 10A is an exploded, perspective view illustrating an MIM resistor obtained from the stacked structure of FIG. 9.

Similar conductive pattern layers to those conductive pattern layers 22a-1, 22a-2, 22a-3, 22a-4, 22a-5, 22a-6, 22a-7, 22a-8, 22a-9, 22a-10 and 22a-11 of FIGS. 3, 4A, 4B, 4C and 4D can be provided for each of the stacked structures S1, S2 and S3 to realize an MIM capacitor and MIM resistors for each of the stacked structures S1, S2 and S3. For example, as illustrated in FIG. 10A, the same conductive pattern layers 22a-3 and 22a-4 of FIG. 4A are formed, so that the resistor R1 of FIG. 4A is obtained for each of the stacked structures S3, S2 and S3.

Figure 10B:
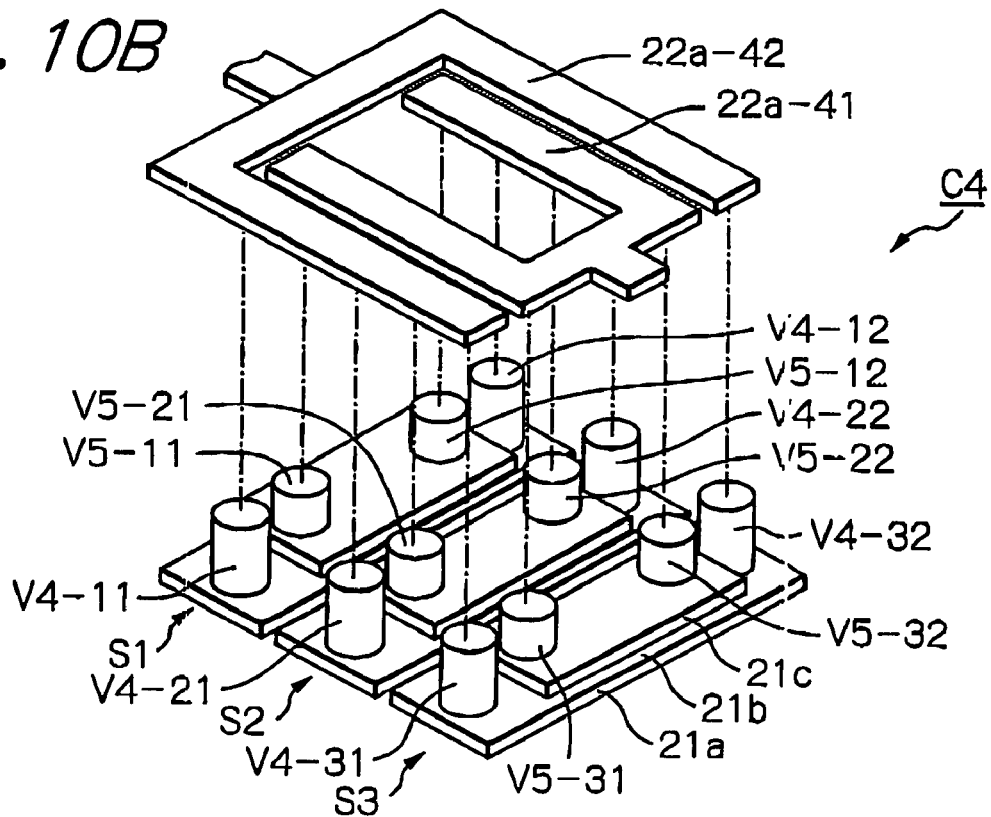
FIG. 10B is an exploded, perspective view illustrating an MIM capacitor obtained from the stacked structure of FIG. 9.

Also, as illustrated in FIG. 10B, upon receipt of the customer's request, conductive pattern layers 22a-41 and 22a-42 are formed, so that the conductive pattern layer 22a-41 is connected to the via structures V4-11, V4-12, V4-21, V4-22, V4-31 and V4-32, and the conductive pattern layer 22a-42 is connected to the via structures V5-11, V5-12, V5-21, V5-22, V5-31 and V5-32. As a result, an MIM capacitor C4 having a capacitance three times that of the MIM capacitor C1 of FIG. 3 is obtained from the stacked structures S1, S2 and S3 of FIG. 9.

In the fourth example as illustrated in FIG. 9, if the number of stacked structures arranged in parallel with each other is increased, the number of realized MIM capacitors and MIM resistors would be increased.

Figure 11:
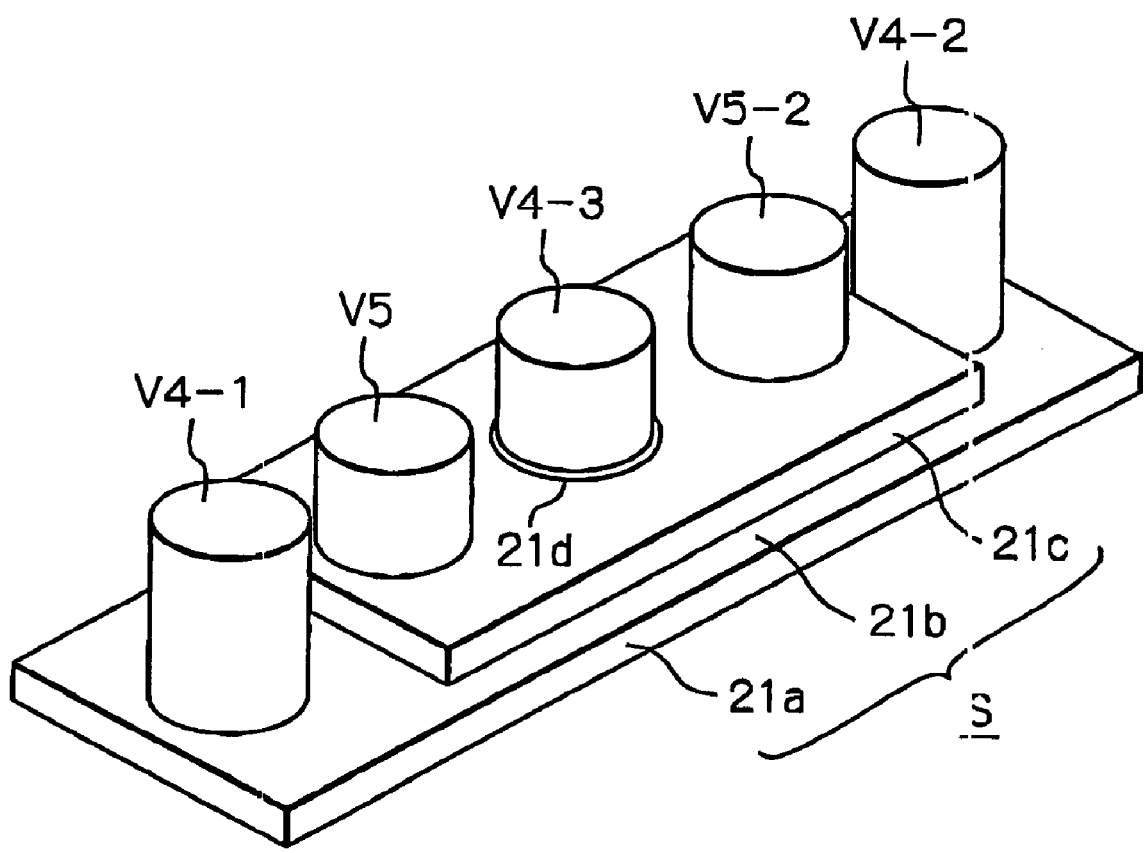
FIG. 11 is a perspective view illustrating a modification of the stacked structure of FIG. 2.

In the above-described examples of the stacked structure as illustrated in FIGS. 2, 5 and 7, the via structures V4-1, V4-2, . . . are formed on an area of the lower electrode layer 21a where the upper electrode later 21c (21c-1, 21c-2) is not formed; however, such via structures can be formed on an area of the lower electrode layer 21a where the upper electrode layer 21c (21c-1, 21c-2) is formed. For example, as illustrated in FIG. 11, a penetration hole 21d is formed in the upper electrode layer 21c and the dielectric layer 21b, and then, an insulating layer is formed within the penetration hole 21d of the upper electrode layer 21c. As a result, a via structure V4-3 is formed within the penetration hole 21d with no contact with the upper electrode layer 21c. Thus, the number of realized MIM capacitors and realized MIM resistors would be increased by the via structure V4-3.

A second embodiment of the method for manufacturing a semiconductor device using a structured ASIC technology according to the present invention is explained next with reference to FIGS. 12A and 12B.

First, referring to FIG. 12A, a semiconductor device is constructed by a common-use section 1.

The common-use section 1 is formed by a semiconductor substrate 11 where impurity diffusion regions, isolation regions and the like (not shown) for semiconductor transistor circuits are formed, and a plurality of insulating interlayers 12, 13 and 14 sequentially formed on the semiconductor substrate 11. In this case, conductive pattern layers 12a are formed on the insulating interlayer 12 before the formation of the insulating interlayer 13, and conductive pattern layers 13a are formed on the insulating interlayer 13 before the formation of the insulating interlayer 14. Also, via structures (or plug structures) V1 are formed within the insulating interlayer 12 so that the conductive pattern layers 12a are connected to respective impurity diffusion regions of the semiconductor substrate 11 and gates of the transistors. Further, via structures (or plug structures) V2 are formed within the insulating interlayer 13 so that the conductive pattern layers 13a are connected to respective conductive pattern layers 12a.

The common-use section 1 is also formed by a plurality of triple-stacked structures (simply referred to as a stacked structures) S having the same structure are formed on the insulating interlayer 13 before the formation of the insulating layer 14.

Each of the stacked structures S is formed by a lower electrode layers 21a, a dielectric layer 21b and an upper electrode layer 21c. The lower electrode layers 21a are located on the same plane, the dielectric layers 21b are located on the same plane, and the upper electrode layers 21c are located on the same plane.

The stacked structures S are manufactured as follows. That is, three layers for the lower electrode layers 21a, the dielectric layers 21b and the upper electrode layers 21c are sequentially deposited on the insulating interlayer 21. Then, the layer for the upper electrode layer 21a is patterned by a photolithography and etching process to complete the upper electrode layers 21c. Then, the layer for the dielectric layers 21b and the layer for the lower electrode layers 21c are together patterned by a photolithography and etching process to complete the dielectric layers 21b and the lower electrode layers 21a. Thus, each of the dielectric layers 21b is provided separately for one of the stacked structures S.

Note that the thickness of the dielectric layers 21b and the thickness and size of the lower electrode layers 21a and the upper electrode layers 1c are definite regardless of the customer's request.

Figure 12B:
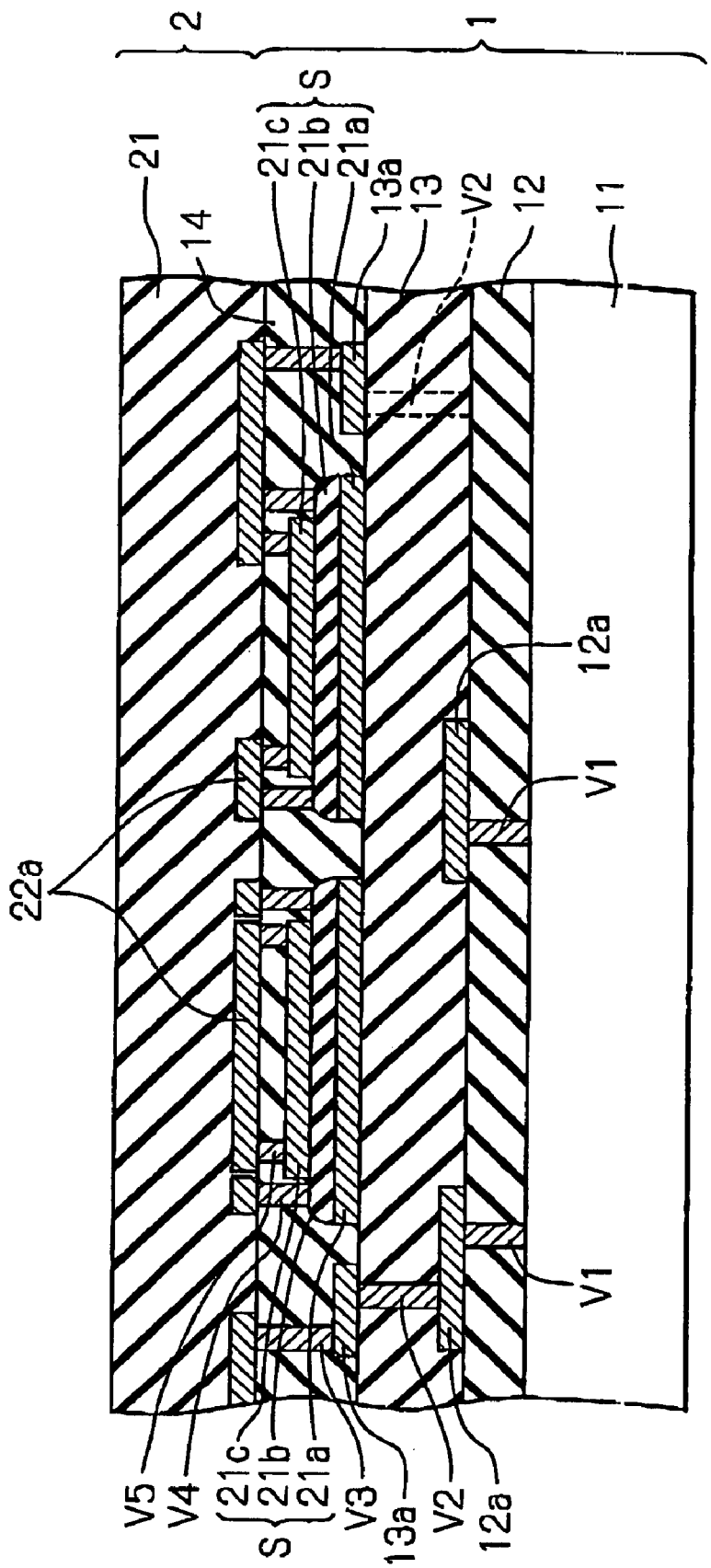

Next, referring to FIG. 12B, via structures (or plug structures) V3, V4 and V5 are formed within tie insulating layer 14 regardless of the customer's request. In this case, the via structures V3 lead to the conductive layers 13a, the via structures V4 lead to the lower electrode layers 21a, and the via structures V5 lead to the upper electrode layers 21c.

Also upon receipt of the customer's request, a customized section 2 is formed on the common-use section 1. The customized section 2 is formed by an insulating layer 21. In this case, conductive pattern layers 22a are also formed on the insulating interlayer 21 to connect the via structures V3, V4 and V5 to each other.

Note that the via structures V1, V2, V3, V4 and V5 can be formed by forming via holes in the insulating interlayers and burying metal therein.

Thus, according to the customer's request, capacitors and resistors having metal-insulator-metal (MIM) structure are formed by the lower electrode layers 21a, the dielectric layers 21b and the upper electrode layers 21c in the common-use section 1, and the capacitors and the resistors are connected to the transistors in the semiconductor substrate 11.

The stacked structures S are the same as those in the first embodiment.

According to the second embodiment, in the common-use section 1, semiconductor circuits are formed regardless of the customer's request. Also, in the customized section 2, the conductive pattern layers 22a are formed upon receipt of the customer's request. At this time, an MIM capacitor and MIM resistors having different resistance values are selected and formed in accordance with the customer's request. In more detail, in the common-use section 1, the capacitance values of the MIM capacitors and the resistance values of the MIM resistors are definite, since the thickness of the dielectric layer 21b and the thickness and size of the electrode layers 21a and 21c are definite. Also, the MIM capacitor and the different resistance values of the MIM resistors can be selected by the conductive pattern layers 22a upon the receipt of the customer's request.

Figure 13:
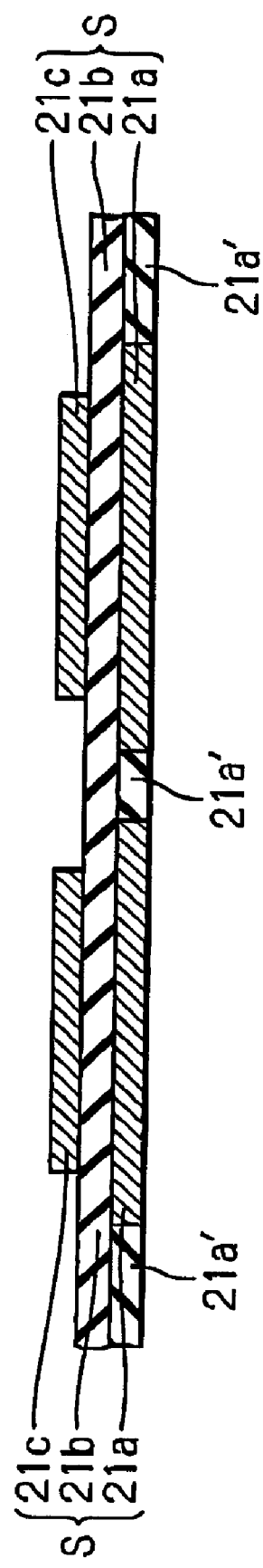
FIG. 13 is a cross-sectional view illustrating a modification of the stacked structure of FIGS. 1A, 1B and 1C and FIGS. 12A and 12B.

In the above-described embodiments, one dielectric layer 21b is provided for one of the stacked structures S; however, as illustrated in FIG. 13, a single dielectric layer can be provided for the stacked structures S. In this case, before the dielectric layer 21b is deposited, the lower electrode layer 21a needs to be patterned by a photolithography and etching process, and then, an insulating layer 21a' is buried by using a chemical-mechanical polishing process to surround the lower electrode layer 21a.

Also, a plurality of stacked structures S can be arranged in rows and columns. In this case, a CMP process can easily be carried out, so that the insulating interlayer above the stacked structures S can easily be flattened. Also, the number of realized MIM capacitors and realized MIM resistors would be increased.

The invention claimed is:

1. A semiconductor device, comprising:
    at least one capacitor;
    at least one resistor;
    a plurality of triple-stacked structures all having the same structure, each of said triple-stacked structures comprising one lower electrode layer, at least one upper electrode layer and one dielectric layer sandwiched by said lower electrode layer and said upper electrode layer;
    a first via structure connected to an end of said at least one upper electrode layer;
    a second via structure connected to an end of said one lower electrode layer;
    a conductive pattern layer above the first via structure and the second via structure; and
    a third via structure,
    wherein a size of said lower electrode layer of each of said plurality of triple-stacked structures is the same with each other,
    wherein said at least one capacitor includes one of said plurality of triple-stacked structures,
    wherein said at least one resistor includes another one of said plurality of triple-stacked structures,
    wherein the conductive pattern layer is adapted to connect the first via structure to the second via structure, and
    wherein the conductive pattern layer is also adapted to connect the third via structure with the first via structure and the second via structure.

2. The semiconductor device as set forth in claim 1, wherein said lower electrode layer of each of said triple-stacked structures is located on a first plane of said semiconductor device, and said upper electrode layer of each of said triple-stacked structures is located on a second plane of said semiconductor device.

3. The semiconductor device as set forth in claim 1, wherein said dielectric layers of said triple-stacked structures comprise a single dielectric layer.

4. The semiconductor device as set forth in claim 1, wherein said at least one capacitor includes connections connected to the lower electrode layer and upper electrode layer of said one of said plurality of triple-stacked structures.

5. The semiconductor device as set forth in claim 1, wherein said at least one resistor includes connections connected to at least one of the lower electrode layer and upper electrode layer of said another one of said plurality of triple-stacked structures.

6. The semiconductor device as set forth in claim 1, further comprising:
    a plurality of conductive pattern layers connected to said first via structure and said second via structure so that said at least one capacitor is realized by connecting at least two of said conductive pattern layers to said lower electrode layer and said upper electrode layer, respectively, of said one of said plurality of triple-stacked structures, and said at least one resistor is realized by connecting at least two of said conductive pattern layers to at least one of said lower electrode layer and said upper electrode layer of said another one of said plurality of triple-stacked structures.

7. The semiconductor device as set forth in claim 6, further comprising:
    a common-use section including various kinds of semiconductor transistor circuits; and
    a customized section formed on said common-use section, said customized section including said triple-stacked structures, said first and second via structures and said conductive pattern layers,
    said common-use section and said customized section further including said third via structure connected to said semiconductor transistor circuits and to said conductive pattern layers.

8. The semiconductor device as set forth in claim 6, further comprising:
    a common-use section including various kinds of semiconductor transistor circuits, said common-use section further including said triple-stacked structures and said first and second via structures; and
    a customized section formed on said common-use section, said customized section including said conductive pattern layers,
    said common-use section and said customized section further including said third via structure connected to said semiconductor transistor circuits and to said conductive pattern layers.

9. The semiconductor device as set forth in claim 1, wherein said lower electrode layer is outwardly protruded from said upper electrode layer.

10. The semiconductor device as set forth in claim 1, wherein said lower electrode layer and said upper electrode layer are both elongated,
    said semiconductor device further comprising:
    a pair of first via structures each connected to one longitudinal side of said lower electrode layer; and
    a pair of second via structures each connected to one longitudinal side of said upper electrode layer.

11. The semiconductor device as set forth in claim 1, wherein said triple-stacked structures are elongated, and some of said triple-stacked structures are arranged in parallel with each other.

12. The semiconductor device as set forth in claim 1, wherein said triple-stacked structures are arranged in rows, columns.

13. The semiconductor device as set forth in claim 1, where a size of said upper electrode layer of each of said plurality of triple-stacked structures is the same with each other.

14. The semiconductor device as set forth in claim 1, further comprising:
    a fourth via structure; and
    a second conductive pattern layer connecting said fourth via structure with said third via structure.

15. The semiconductor device as set forth in claim 1, wherein the plurality of triple-stacked structures are arranged in parallel with each other.

* * * * *